United States Patent [19]

Harthill et al.

[11] 4,071,821

[45] Jan. 31, 1978

[54] QUADRATURE CORRELATION PHASE DETERMINING APPARATUS

[75] Inventors: William P. Harthill; James L. Roberts, both of Seattle, Wash.

[73] Assignee: Honeywell Inc., Minneapolis, Minn.

[21] Appl. No.: 681,103

[22] Filed: Apr. 28, 1976

[51] Int. Cl.² .................................................. G01R 25/00
[52] U.S. Cl. ................................ 324/83 R; 324/83 Q; 324/83 D; 328/140; 364/728
[58] Field of Search .................. 328/166, 140, 141; 324/82, 83 R, 83 D, 83 Q, 140 D; 235/181

[56] References Cited

U.S. PATENT DOCUMENTS

| | | | |
|---|---|---|---|
| 3,464,016 | 8/1969 | Kerwin et al. | 328/166 |
| 3,553,579 | 1/1971 | Teixeira | 324/83 D |
| 3,633,117 | 1/1972 | Reilly | 324/83 Q |
| 3,641,445 | 2/1972 | Green | 324/83 Q |
| 3,740,655 | 6/1973 | Dickey | 328/140 |
| 3,745,559 | 7/1973 | Mattern | 324/83 D |

Primary Examiner—M. Tokar
Attorney, Agent, or Firm—Charles L. Rubow

[57] ABSTRACT

Digital apparatus and a method are disclosed for determining the phase angle of a tone signal of known frequency by correlating a clipped version of the tone signal with a reference signal having a repetition rate equal to the tone frequency. Correlation is accomplished by multiplying the clipped tone signal with each of quadrature components of the reference signal and sampling the product signals to provide binary sample trains which are supplied to a pair of shift register accumulators which effectively frame a moving phase measurement window. Reversible counters and associated logic determine the magnitudes and signs of differences in numbers of samples of noncorresponding binary values in each of the accumulators, and provide counts representative of in-phase and quadrature components of the product of the tone signal and the reference signal. The counts are utilized in a digital processor to compute the phase angle of the tone signal relative to the reference signal.

14 Claims, 6 Drawing Figures

QUADRATURE CORRELATION PHASE DETERMINING APPARATUS

BACKGROUND OF THE INVENTION

The present invention relates generally to signal phase detection, and more specifically to apparatus and techniques employing quadrature correlation to determine the phase angle between two signals.

The relative phase between two periodic signals, one of which may be a reference signal, is utilized in a variety of apparatus for communication, testing and evaluation, object detection and/or object location, as well as for the other purposes. Both analog and digital techniques are known for accomplishing phase measurements. Where noise free and undistorted signals are involved and the phase angles to be measured vary over a limited range of angles, the measurement may be made with relatively simple apparatus. However, an increasing number of requirements exist for apparatus capable of reliably and accurately measuring the phase of signals which are not free of noise and/or distortion, and of measuring phase angles over a range of up to 360°.

Measurement of phase over an extended range of phase angles by means of many prior art technqiues may result in ambiguities unless special provisions are made for determining which quadrant or 180° sector contains the angle of interest. Such special provisions frequently comprise separate circuitry for making "coarse" and "fine" determinations which may establish the sector and the magnitude of the angle within that sector respectively. Noise tends to introduce errors into phase measurements. To comply with more demanding requirements, it is often necessary to employ averaging and/or filtering to minimize errors resulting from noise and/or distortion.

Typical prior art circuits for providing phase measurements over an extended range of phase angles are shown in U.S. Pat. Nos. 3,286,176, 3,559,161 and 3,663,956 issued to M. H. Birnboim, I. G. Raudsep and B. W. Purdy et al. on Nov. 15, 1966, Jan. 26, 1971 and May 16, 1972 respectively. In each of these systems sinusoidal input signals are converted to square wave signals. A timing interval is initiated at a detectable reference time and utilized to provide a coarse phase angle determination. A counter is employed to monitor a higher repetition rate clock pulse train during the coarse timing interval to provide a fine phase angle determination.

More recent techniques for accomplishing phase angle measurement over an extended range of phase angles are shown in an article entitled "Edge-triggered flip-flops make 360° phase meter" in the Aug. 21, 1975 issue of "Electronics" on pages 100 and 101, and in U.S. Pat. No. 3,906,361 issued to N. Nessler et al. on Sept. 16, 1975. The technique disclosed in the "Electronics" article is based on the assumption that an arbitrarily chosen one of two input signals lags the other. It utilizes a pair of interconnected edge triggered flip flops to generate a saw tooth waveform which increases from zero to a maximum value as the phase difference increases from zero to 360°. The technique employed in the Nessler et al. patent utilizes information concerning the first to occur of negative going zero crossings of the input signals in addition to the angular difference between zero crossings to unambiguously determine phase angles from −180° to +180°.

It is known that digital systems in general have certain inherent advantages over analog systems. Some of these are set forth in U.S. Pat. No. 3,039,094 issued to V. C. Anderson on June 12, 1962 which discloses a digital system for beam steering of a fixed transducer array. One disclosed embodiment utilizes a shift register memory apparatus to accomplish beam steering.

Among the general advantages set forth for digital systems are that the digital signals produced thereby and used therein are directly compatible with digital computers, which provide great flexibility and signal processing power. Also, the use of digital signal processing provides for a normalized output characterized by a true signal-to-noise ratio rather than proportionality to either signal or noise alone. This normalization reduces the dynamic range requirements of components and circuits used in the system, since variations in background noise do not change the reference noise output of the system. Further, digital systems are minimally susceptible to errors and changes in calibration caused by aging of components and changes in operating parameters.

As also discussed in U.S. Pat. No. 3,039,094, in many situations the polarity of a band limited signal contains nearly as much information as the complete analog signal itself. This principle may be advantageously applied by dividing an input analog signal of interest into two classes determined by its instantaneous polarity, and representing it by a time series consisting of two possible voltage states. This so called "clipped signal" may be simply and conveniently produced by a clipper or clipping amplifier. The clipping level may be set to a level desirable for subsequent digital signal processing, and the voltage states assigned values of +1 and −1.

U.S. Pat. No. 3,039.094 further states that, "a band limited signal may be represented by a sequence of individual amplitude samples providing the sampling rate is equal to or greater than twice the highest frequency in the signal." This principle and the principle of the preceding paragraph can be combined to permit the input signal to be represented by a set of binary digits, each sample having a value of +1 or −1, depending on the polarity of the input signal at the sampling instant.

It is also known that signal correlation techniques may be advantageously utilized to overcome detrimental effects of noise and/or distortion in the input signals. Both analog and digital forms of signal correlation are known. For example, U.S. Pat. No. 3,346,862 issued to I. G. Raudsep on Oct. 10, 1967 discloses an analog autocorrelation system for determining the time difference between a pair of pulse signals of common origin. The system employs weighting filter means for modifying the power spectra of the pulse signals to optimize the autocorrelation function. U.S. Pat. No. 3,646,334 issued to Ivar Wold on Feb. 29, 1972 discloses a hybrid analog/digital system in which two input signals to be correlated are sampled, the samples of one of the signals inserted into a recirculating memory time compressor, the output of the memory multiplied with the other signal, and the product signal averaged to determine the correlation of the input signals.

Other known refinements in correlation techniques involve multiplication of the input signal with each of quadrature components of a reference signal. The product signals are integrated with respect to time to produce real and imaginary components of correlation of the input and reference signals. The real and imaginary components are combined in accordance with the Pythagorean theorem to produce an indication of correlation of the signals. A variation of this method is embodied in a signal processor disclosed in U.S. Pat. No. 3,878,526 issued to N. E. Pedersen on Apr. 15, 1975. As is typical of traditional quadrature demodulation systems, the Pedersen processor involves an analog implementation.

The applicants have uniquely combined the advantages of quadrature correlation and digital signal processing utilizing clipped signals to provide a clipped quadrature correlation phase determining method and apparatus. The method and apparatus provide exceptionally high immunity to errors introduced by noise and distortion, and permit reliable and accurate determination of phase angles throughout a 360° range through the use of a unique and simple algorithm which may be executed with minimum computational capabilities.

SUMMARY OF THE INVENTION

The applicants' unique phase determining apparatus basically comprises clipping means for hard limiting or clipping a tone signal of known frequency, and a reference signal generator for producing first and second quadrature related square wave signals each having a repetition rate equal to the tone frequency. The clipped tone signal and each of the first and second square wave signals are multiplied by digital multiplication means to produce first and second product signals respectively, each having first or second instantaneous values depending on the relative instantaneous amplitudes of the clipped signal and square wave signals. Sampling means is provided for sampling the product signals, and supplying the samples to moving window counter means operable to produce first and second counts indicative of the magnitudes and senses of differences in numbers of samples having first and second values in each of the sample trains during a moving time interval of predetermined duration. The counts are indicative of in-phase and quadrature components of the product of the tone signal and the reference signal, and are utilized in computing means which is operable to compute therefrom the phase angle of the tone signal relative to the reference signal.

The method of the applicants' invention basically comprises hard limiting a tone signal of known frequency to produce a clipped signal, and multiplying the clipped signal with each of first and second quadrature related square wave signals having a repetition rate equal to the tone frequency to produce first and second product signals, each having first or second instantaneous values depending on the relative amplitudes of the clipped and first and second square wave signals. The product signals are sampled and the magnitudes and senses of differences in numbers of samples having first and second values during a moving time interval of predetermined duration are counted. The counts are processed in accordance with a phase computing algorithm to determine the phase angle of the tone signal relative to the reference signal.

Accordingly, the primary object of this invention is to provide unique clipped quadrature correlation phase detection apparatus characterized by exceptional capability for accurately measuring the phase angle of a signal which may be contaminated with noise.

It is a further object of this invention to provide a phase detection method and apparatus utilizing clipped quadrature correlation techniques.

A further object is to provide apparatus and a technique for detecting phase angles throughout a 360° range by means of an algorithm requiring minimum computational capabilities.

Yet a further object is to provide a detection apparatus and a technique particularly suitable for use in position determining systems.

Additional objects of the invention may be ascertained from a study of the disclosure, drawings and appended claims.

DESCRIPTION OF THE PREFERRED EMBODIMENT

Figure 1:
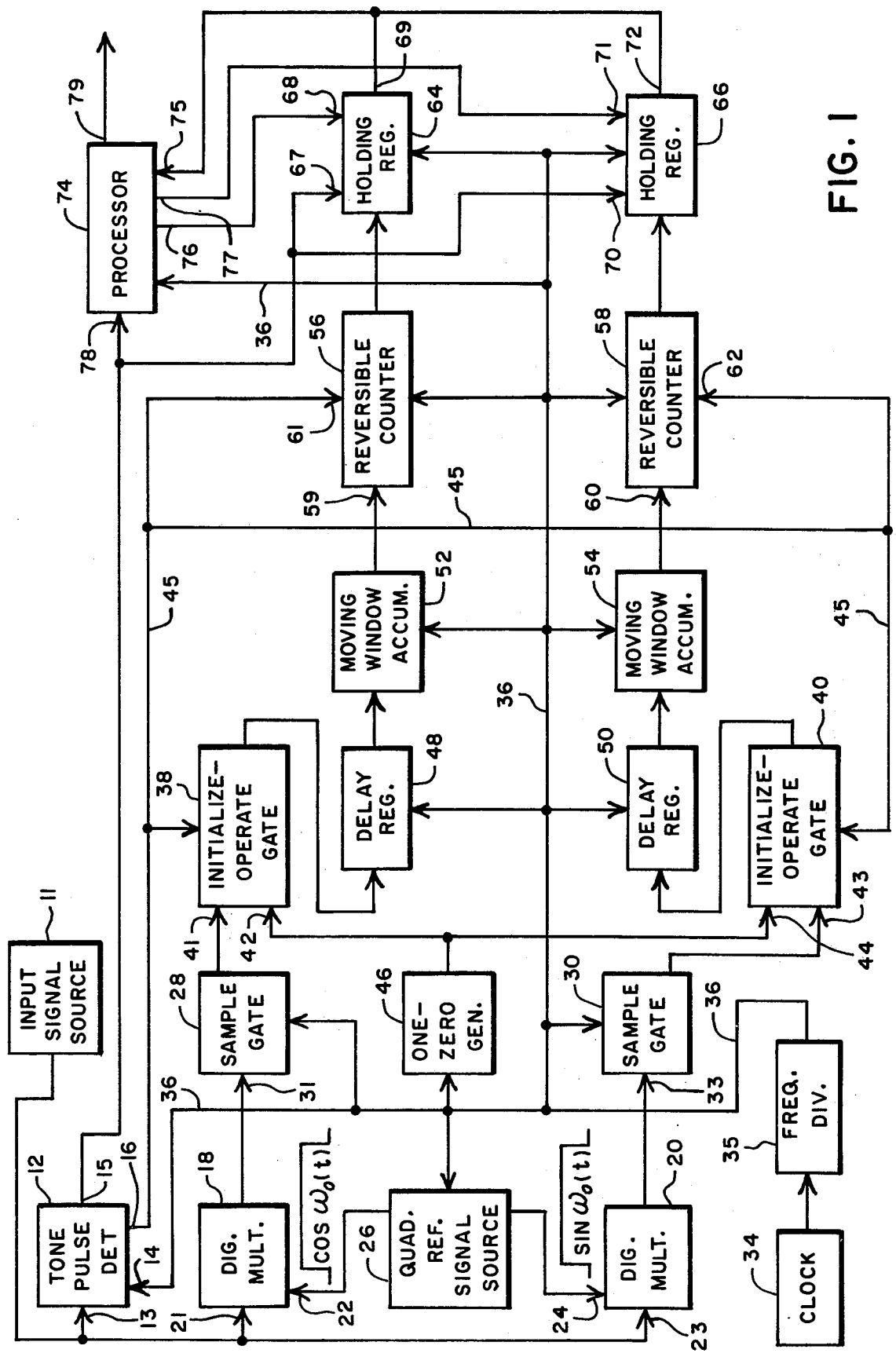
FIG. 1 is a functional block diagram of phase detection apparatus in accordance with the applicants' invention.

In the block diagram of FIG. 1, reference numeral 11 identifies an input signal source which supplies a clipped input signal $\overline{S(t)}$ to following portions of the phase determinating apparatus. The clipped input signal may have been derived from a signal received by a transducer, antenna or other signal receiver. The received signal includes a tone of known frequency $f_o$, and may have random noise superimposed thereon. For illustrative purposes, it is further assumed that the tone arrives in periodic pulses of known duration and repetition interval.

Figure 2:
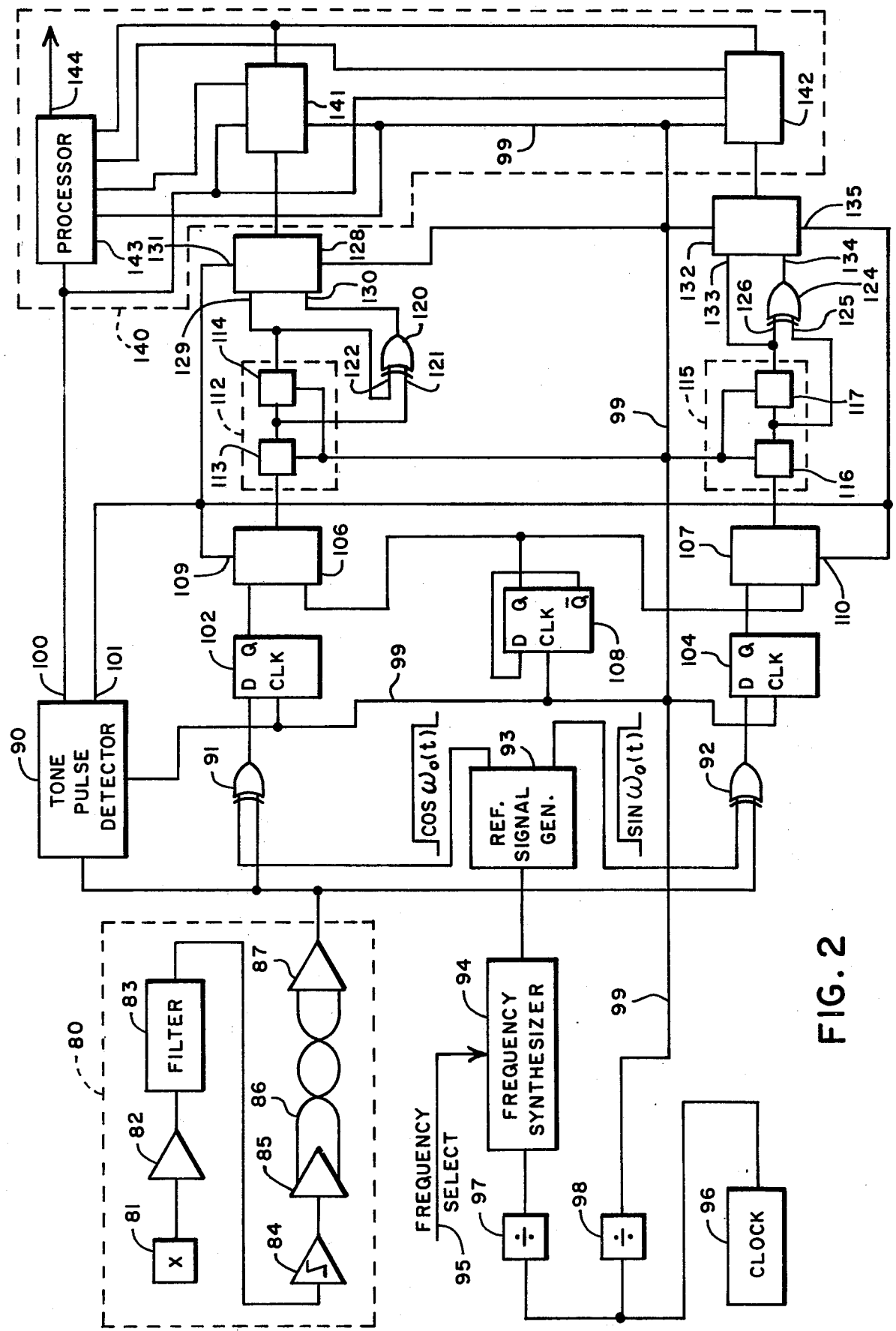
FIG. 2 is a schematic diagram of the preferred embodiment of the phase detection apparatus of FIG. 1.

Input signal source 11 contains means, of which an example is shown in more detail in FIG. 2, for normalizing the amplitude of the received signal by hard limiting or clipping so as to limit the amplitude to a predetermined level. The clipping process preserves the information contained in the zero crossings of the received signal. Accordingly, clipped input signal $\overline{S(t)}$ comprises a rectangular waveform having predetermined upper and lower amplitudes. Further, this signal may be conveniently converted into a binary signal compatible with well known digital processing techniques and logic elements. Conversion may be accomplished by simply shifting the signal voltage so that its upper and lower amplitudes correspond to system voltage levels representing binary 1s and 0s. For purposes of the remainder of this description, it will be assumed that the upper and lower amplitudes of the clipped input signal are represented by 1s and 0s respectively.

Assuming the ideal case in which no noise is present, clipped input signal $\overline{S(t)}$, during receipt of a pulse, comprises upper and lower (or binary 1 and 0) portions of uniform duration. This rectangular wave signal has a repetition rate equal to the tone signal frequency. In the more realistic case in which random noise is present, the intervals of clipped input signal $\overline{S(t)}$ between pulses comprises a rectangular wave signal in which the upper and lower portions are of random duration. Further, even when a tone signal is present, if the amplitude of the noise exceeds the tone signal amplitude, the regularity of the rectangular waveform will be momentarily altered.

Clipped input signal $S(t)$ is supplied to a tone pulse detector 12 which is preferrably of the type described and shown in detail in copending patent application Ser. No. 678,016, filed Apr. 19, 1976 in the name of James L. Roberts for a "Quadrature Correlation Pulse Detector", and assigned to the same assignee as the present application. It is pointed out that both the tone pulse detector of the copending application and the present phase determining apparatus utilize implementations of the same clipped quadrature correlation technique. Accordingly, certain elements, such as the input signal source, a quadrature reference signal source, timing circuitry and circuitry for periodically establishing initial conditions, may be common to both the pulse detector and the phase determining apparatus. Certain additional elements are separately included in and operate in the same manner in both devices. Reference may be made to the copending application for a complete description of the structure and operation of detector 12 and other common subject matter.

Briefly, detector 12 has an input terminal 13 through which the input signal $S(t)$ is supplied, a timing input terminal 14, a pulse detection output terminal 15, and a clear correlator output terminal 16. Detector 12 functions to detect a tone pulse of known frequency, duration and repetition interval timed to occur during a pulse detection window established by the detector. Following detection of a pulse, detector 12 produces a pulse detection signal at output terminal 15, and a clear correlator signal at output terminal 16.

Clipped input signal $S(t)$ is also supplied to a pair of digital multipliers 18 and 20. Multiplier 18 has a first input terminal 21 to which the clipped input signal is supplied, a second input terminal 22 and an output terminal. Similarly, multiplier 20 has a first input terminal 23 to which the clipped input signal is supplied, a second input terminal 24 and an output terminal.

Reference numeral 26 identifies a quadrature reference signal source which produces first and second square wave signals $\cos \omega_o(t)$ and $\sin \omega_o(t)$. As apparent from the signal functions, the square wave signals are 90° out of phase or in quadrature with one another. They also have a repetition rate equal to the tone frequency, and upper and lower values of 1 and 0. The first and second square wave signals may be considered quadrature components of a square wave reference signal.

The first and second square wave signals are supplied to input terminals 22 and 24 respectively of digital multipliers 18 and 20. Multipliers 18 and 20 produce first and second product signals having rectangular waveforms. Digital multiplication may be accomplished with exclusive OR circuits, or other circuits or devices which operate to produce a characteristic output only when both input signals have corresponding values.

The first and second product signals are supplied to sample gates 28 and 30 respectively. Sample gate 28 has an input terminal 31 connected to receive the first product signal, a control terminal and an output terminal. Similarly, sample gate 30 has an input terminal 33 connected to receive the second product signal, a control terminal and an output terminal. Sample gates 28 and 30 are caused to sample the product signals at a predetermined sample rate $f_s$ adequate to retain the desired information in the input tone signal, and to produce first and second sample trains at their respective output terminals. The relationship between sampling rate, tone frequency and certain other system parameters necessary for maximum accuracy and phase angle resolution will be discussed hereinafter in greater detail. The sampling rate is controlled by a clock 34 and frequency divider 35 which produce a timing pulse train on conductors 36 for timing and synchronizing operation of various portions of the phase determining apparatus. As shown, sample gates 28 and 30 are controlled by timing pulses supplied to their respective control terminals.

The first and second sample trains, which comprise uniformly spaced short duration pulses having values of either 1 or 0, are supplied to gates 38 and 40 respectively, each of which is designated in FIG. 1 as an initialized-operate gate. Gate 38 has a first input terminal 41 connected to receive the first sample train, a second input terminal 42, a control terminal and an output terminal. Similarly, gate 40 has a first input terminal 43 connected to receive the second sample train, a second input terminal 44, a control terminal and an output terminal. Each of gates 38 and 40 operates such that an appropriate signal at its control terminal will cause a signal at one of its input terminals to be transmitted to its output terminal.

For purposes of the following description, it may be assumed that gates 38 and 40 each operate such that in the absence of a signal at its control terminal, the sample train at its first input terminal is transmitted to its output terminal. The control terminals are connected to receive the clear correlator signal from output terminal 16 of pulse detector 12 through conductors 45. No clear correlator signal is present during the actual phase determining process. Therefore, during that time the first and second sample trains are produced at the output terminals of gates 38 and 40 respectively.

Second input terminals 42 and 44 of gates 38 and 40 are connected to the output terminal of a one-zero generator 46 which receives timing signals through conductors 36, and produces a pulse train of alternating 1-0 values having a repetition rate equal to one half of the sampling rate. This 1-0 signal is produced at the output terminals of gates 38 and 40 when a clear correlator signal is present.

The output signals of gates 38 and 40 are supplied to delay registers 48 and 50 respectively, whose function will hereinafter be described in greater detail. The output signals of delay registers 48 and 50 are supplied to moving window accumulators 52 and 54 respectively. Delay register 48 and accumulator 52 together may comprise a multisegment shift register in which one segment forms the delay register and following segments from the accumulator. Similarly, delay register 50 and accumulator 54 together may comprise a multisegment shift register. The delay registers and moving window accumulators are under the control of the timing pulse train on conductors 36, and operate to accept the output signals from gates 38 and 40, and shift the signals seriatim to the accumulator output terminals. The portions of the shift registers comprising accumulators 52 and 54 each have N storage locations, and serve to frame a phase detection window whose duration is equal to the duration of the pulse detection window established in pulse detector 12.

As described in detail in the previously identified copending patent application, pulse detector 12 produces a pulse detection signal as a detected pulse leaves the pulse detection window established therein. Delay registers 48 and 50 serve to delay entry of the tone pulse sample trains into accumulators 52 and 54 by an interval of sufficient duration to cause the phase detection window framed by the accumlators to be centered on the tone pulse when the pulse detection signal is produced.

Figure 3:
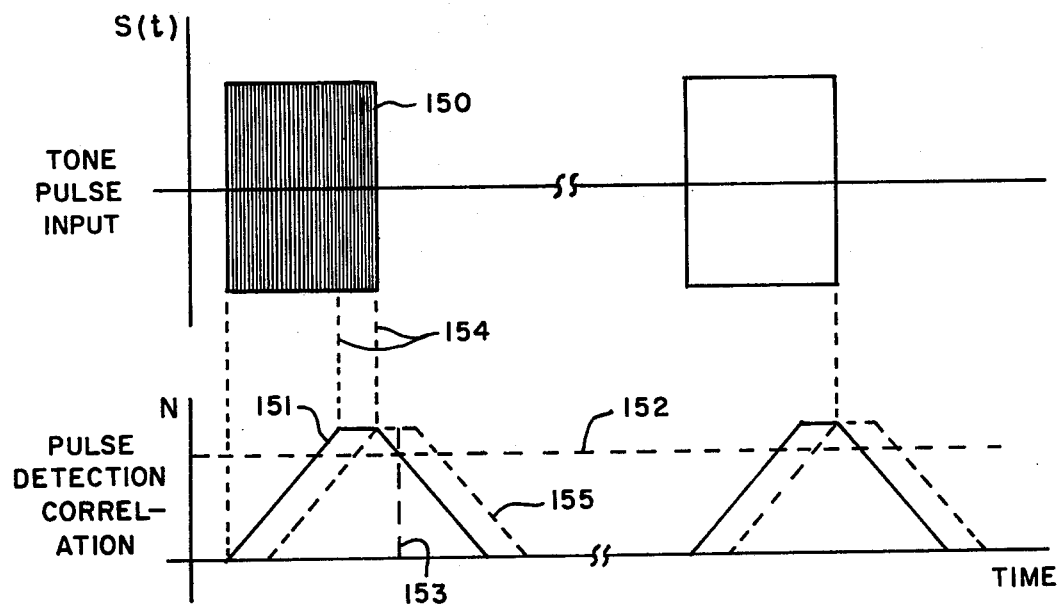
FIG. 3 illustrates the relationship between a train of input tone pulses and the resulting moving correlation signal.

The timing of the pulse and phase detection windows and the pulse detection signal can be seen in FIG. 3 wherein a tone pulse as identified by reference numeral 150 results in a moving correlation signal illustrated by solid line 151. It is pointed out that the correlation function is characterized by a flat top because the duration of the pulse is longer than the pulse detection window, whose width is determined in part by the number of storage locations in shift registers in pulse detector 12. Thus, a maximum correlation signal exists as long as the pulse fills the window.

The dashed line identified by reference numeral 152 represents a correlation threshold indicative of presence of a pulse in the pulse detection window. The pulse detection signal is produced following presence of a pulse at the pulse detection window and when the correlation level falls back through the threshold, as indicated at 153. Delay registers 48 and 50 provide a delay of the duration shown between dashed lines 154, whereby the pulse, as indicated by dashed line correlation function 155, is centered on the phase detection window when the pulse detection signal occurs.

Each of accumulators 52 and 54 has associated therewith logic which produces a signal when the samples entering and leaving the accumulator have different values. Stated otherwise, the logic associated with each shift register produces a signal only when the relative number of 1s and 0s in the shift register is changing. It may further be observed that a change in the relative number of 1s and 0s in each shift register is indicative of a change in the degree of correlation between the tone signal and one of the quadrature components of the square wave reference signal.

The output signals of accumulators 52 and 54 comprise trains of samples having values of either 1 or 0. These samples are supplied to reversible counters 56 and 58 respectively, each of which has control terminal means identified by reference numerals 59 and 60. Counters 56 and 58 have a minimum counting range of from −N to +N, and are operable when enabled to count in one sense in response to signals having a value of 1 and to count in the opposite sense in response to signals having a value of 0. The sample trains supplied to control terminal means 59 and 60 cause the counters to generate counts indicative of the differences in numbers of 1s and 0s in the associated accumulators. Counters 56 and 58 also have reset terminals 61 and 62 respectively connected to receive the clear correlator signal, and operable in response to the clear correlator signal to reset the counts in the counters to 0.

The counts in counters 56 and 58 are supplied to holding registers 64 and 66 respectively. Holding register 64 has a first control terminal 67 for receiving a signal to cause it to hold the count supplied to its input terminal and a second control terminal 68 for receiving a signal to cause it to produce the count held therein at its output terminal 69. Similarly, holding register 66 has a first control terminal 70 for receiving a signal to cause it to hold the count supplied to its input terminal and a second control terminal 71 for causing it to produce the count held therein at its output terminal 72.

First control terminals 67 and 70 are connected to receive the pulse detection signal from output terminal 15 of pulse detector 12. Accordingly, the counts in counters 56 and 58 at the time a pulse detection signal is produced are held in registers 64 and 66. Second control terminals 68 and 71 are supplied with signals to cause the registers to produce the counts held therein at an appropriate time as will be described.

Reference numeral 74 identifies a digital signal processor capable of computing the phase angle of the tone signal relative to the reference signal from the counts produced at output terminals 69 and 72 of holding registers 64 and 66. The counts at the holding register output terminals are shown supplied to a data input terminal 75 of processor 74. In addition, holding register control terminals 68 and 71 are shown connected to receive addressing signals from terminals 76 and 77 respectively of the processor. Accordingly, registers 64 and 66 may be individually addressed and caused to serially transfer the counts held therein to processor 74 through a single data input terminal.

Processor 74 may be used to satisfy a variety of computational needs during intervals when phase angle computations are not actually being performed. Accordingly, the pulse detection signal produced by tone pulse detector 12 is supplied to an interrupt terminal 78 of processor 74. This signal serves to interrupt other computational processes being carried on by processor 74 so that a phase angle may be computed. A singal indicative of the phase angle is then produced at output terminal 79.

The process required to compute phase angle from the counts in holding registers 64 and 66 can best be described by reference to FIGS. 4 and 5. The counts generated by reversible counters 56 and 58 comprise digital representations of the real and imaginary components of the phase angle of the tone signal relative to the reference signal. It can be shown that digitally represented real and imaginary components, $R(k)$ and $I(k)$, vary with phase angle, $\phi(k)$, in accordance with infinite series represented by symmetrical triangular waveforms shown in FIG. 4, waveforms (a) and (b) respectively. The existence of such a relationship between the counts and the phase angle permits phase angle computations by means of an exceptionally simple algorithm. Specifically, the 90° sector including the phase angle is determined by the polarities of the counts and which of the counts has a larger magnitude. The angluar difference between the nearest zero crossing of the count functions is determined by the magnitude and polarity of the smaller count. More specifically, the magnitude of the smaller count determines the angular difference between the phase angle and the nearest zero crossing, and polarity of the count determines the direction from the zero crossing.

Figure 4A:
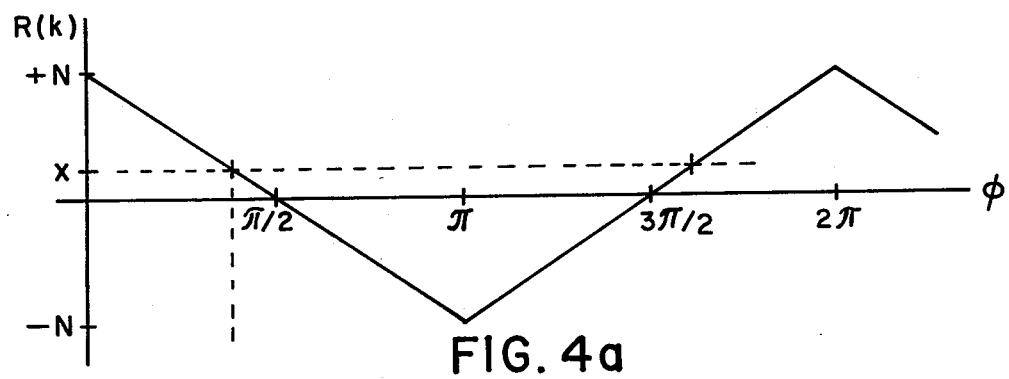
FIG. 4a and 4b illustrate the relationships between phase angle and sample counts generated at certain points in the applicants' phase determining apparatus.
Figure 4B:
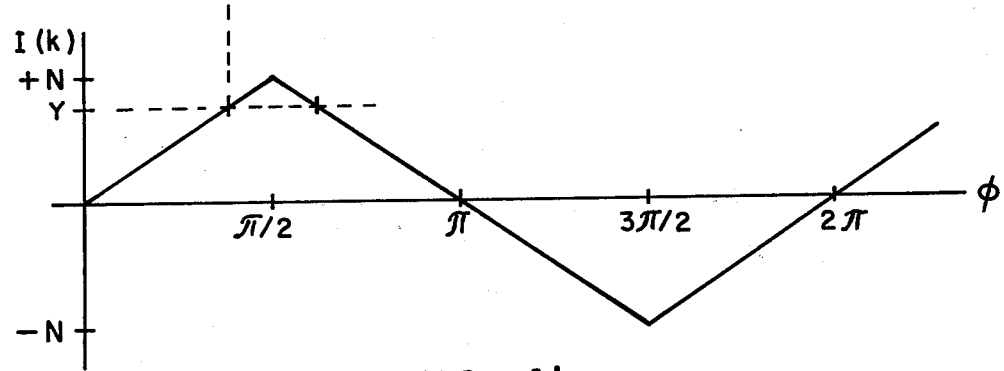

By way of a specific example, assume that the count at output terminal 69 of register 64 has a value of X as illustrated in FIG. 4(a), and assume that the count at output terminal 72 of register 66 has a value of Y as illustrated in FIG. 4(b). As shown, the magnitude of Y is greater than the magnitude of X, and both X and Y have positive polarities. It can be seen that the magnitude of Y is greater than the magnitude of X, and that Y (the larger of the counts) is positive only within a unique 90° sector of phase angles. Specifically, that sector lies between phase angles of 45° and 135°. The nearest zero crossing of the count functions is the $\pi/2$ crossing of the function in FIG. 4(a). The magnitude of X determines the angular difference between $\pi/2$ and the phase angle, and the fact that X is positive determines that the phase angle is less than $\pi/2$.

Figure 5:
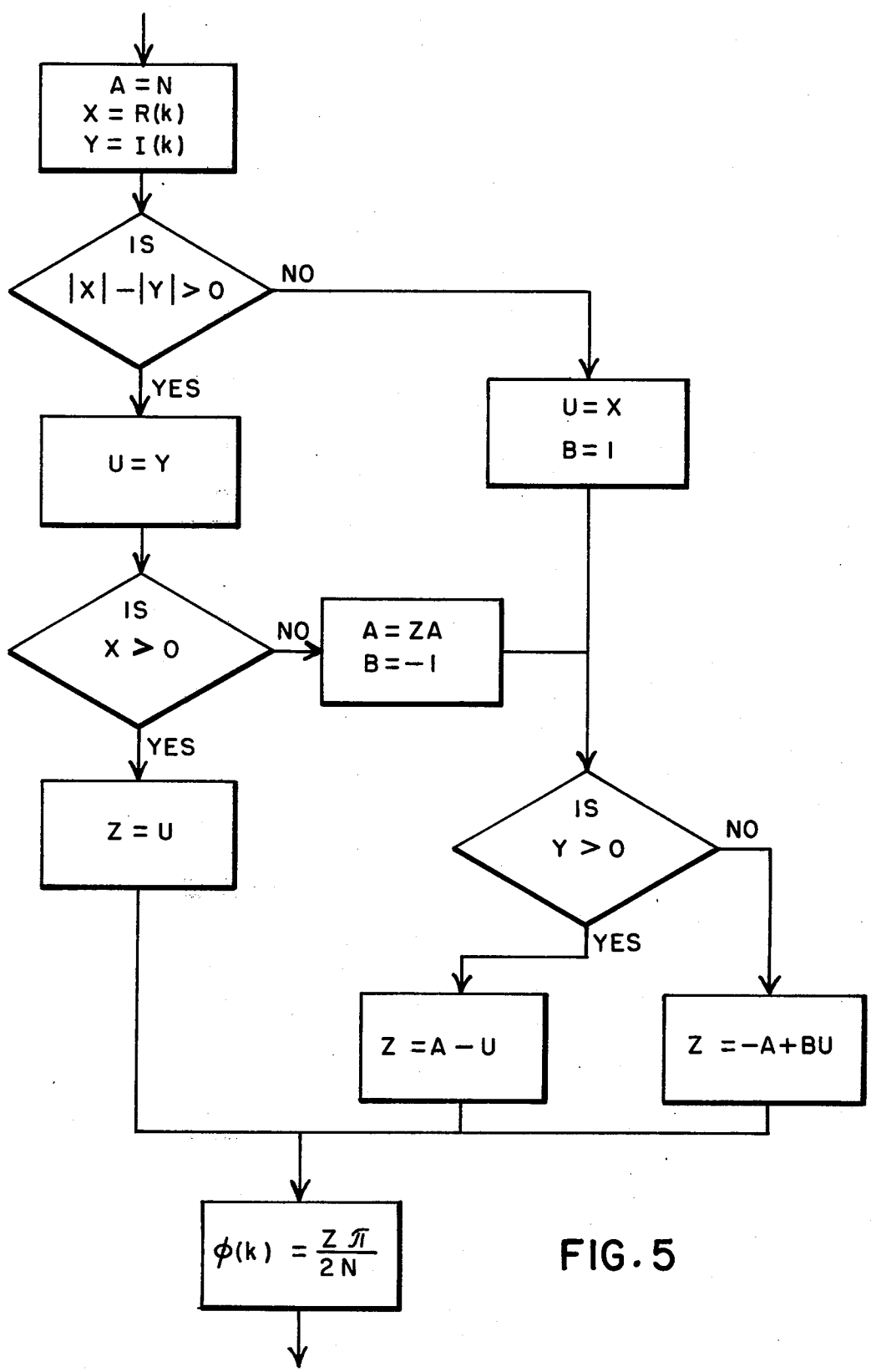
FIG. 5 is a flow chart of an algorithm for computing phase angle from the sample count relationships shown in FIG. 4.

This process can be carried out by a simple algorithm for which the flow chart is shown in FIG. 5. The initial constant A is determined by the number of storage locations in each of accumulators 52 and 54. Remaining portions of the flow diagram closely follow the preceding description, and result in determination of the phase angle $\phi(k)$. A processor suitable for carrying out this algorithm is a commercially available 16 bit microprocessor marketed by National Semiconductor and designated Model IMP-16C.

It should be noted that because of the sampling nature of the present phase detection apparatus, the relationships shown in FIG. 4 are strictly correct only at discrete points along the illustrated functions. The fact that $R(k)$ and $I(k)$ vary linearly over a range of N discrete values as $\phi(k)$ varies from 0° to 90°, 90° to 180°, etc. suggests that the angular resolution of the phase computing process is 180°/N. This is true provided the proper relationship exists between the tone frequency $f_0$, the sampling rate $f_s$ and N. To avoid introduction of an error which can result from having a nonintegral number of $f_0$ cycles within the N sample phase detection window, the relationship between $f_0$, $f_s$ and N should be $Nf_0/f_s = M$, where M is an integer and equal to the number of cycles of $f_0$ during the period of N samples.

In order to realize the maximum phase resolution capability of the disclosed phase detection apparatus, the apparatus should be implemented so that $R(k)$ and $I(k)$ change in minimum size increments as $\phi(k)$ varies in a continuous manner. A minimum size increment is two units at a time since each accumulator has a fixed number of storage locations, and as the number of 1 (or 0) samples therein changes in one sense, the number of 0 (or 1) samples therein must change in the opposite sense, thus resulting in a minimum incremental difference of two. In order to achieve this criteria, N and M must be related such that $N/M = I \pm P/M$, where $I$ and $P$ are integers and $P$ has a value such that $P/M$ is a non-reducible fraction. For example, if $N = 769$ storage locations or samples and $f_s = 769$ kHz, the corresponding time interval is $T = M/f_s$ or 1 millisecond. A tone frequency $f_0$ of 26 kHz results in a quotient N/M of 29 + 15/26. Thus I = 29 and P/M = 15/26 which is a non-reducible fraction. This produces the maximum phase resolution of 0.23°.

With reference to the schematic diagram of FIG. 2, reference numeral 80 identifies an input signal source which is shown as comprising a transducer 81, a preamplifier 82, a bandpass filter 83, a clipping amplifier 84, a line driver 85, a transmission line 86 and a line receiver 87. Transducer 81, which is shown as a hydrophone, is provided for sensing a tone signal of a known frequency. The tone signal may comprise a train of tone pulses of known duration and repetition interval. The sensed signal is supplied to preamplifier 82 and then to bandpass filter 83 which passes signal frequency components within a frequency band of interest. The filtered signal is hard limited or clipped by means of clipping amplifier 84 to produce a rectangular wave signal having either of two instantaneous amplitudes. The clipped signal is supplied to line driver 85 to be transmitted over transmission line 86 and received by line receiver 87. The output of amplifier 87 may be assumed to be a binary rectangular wave signal having an upper value of 1 and a lower value of 0.

The output signal of amplifier 87 is designated as $S(t)$ and is supplied to a tone pulse detector 90 which is preferably of the type disclosed in detail in the previously identified copending patent application. Following detection of a tone pulse, pulse detector 90 produces a pulse detection signal at a first output terminal 100 and a clear correlator signal at a second output terminal 101. The pulse detection and clear correlator signals are used in remaining portions of the phase determining apparatus as will hereinafter be described in greater detail.

Signal $S(t)$ is also supplied as a first input signal to first and second exclusive OR circuits 91 and 92. Exclusive OR circuits 91 and 92 function as digital multipliers to multiply signal $S(t)$ with quadrature components $\cos \omega_0(t)$ and $\sin \omega_0(t)$ of a square wave reference signal. Signals $\cos \omega_0(t)$ and $\sin \omega_0(t)$ are generated by a reference signal generator 93, and have a repetition rate controlled by a frequency synthesizer 94 so as to correspond to the tone frequency of interest.

Frequency synthesizer 94 has a frequency selection input terminal 95 through which a signal may be supplied so as to permit phase measurements to be made as to tone signals having any of a plurality of desired frequencies. The clock signal for synthesizer 94 originates at a clock 96 and is suitably reduced by a first frequency divider 97 before being supplied to synthesizer 94.

A second frequency divider 98 is also connected to receive the signal from clock 96, and produce a clock pulse train on conductors 99 for controlling and synchronizing operations of various other portions of the phase detection apparatus. It should be noted that although a single set of conductors 99 for supplying the clock signals is shown, the phase detection apparatus may require timing signals of various phases and/or time delays for optimum operation. Accordingly, divider 98 and conductors 99 represent means for producing timing and synchronization signals as required.

The first and second product signals produced by exclusive OR circuits 91 and 92 are supplied to the D terminals of edge triggered flip flops 102 and 104 respectively. Flip flops 102 and 104 serve to sample the product signals at a rate determined by a timing signal at the clock terminals of the flip flops, and supply sample trains indicative of the values (either 1 to 0) of the product signals at the sampling instants. The clock terminals of flip flops 102 and 104 are supplied with the timing signals on conductors 99.

The sample trains produced by flip flops 102 and 104 are supplied to first input terminals of a pair of selector gates 106 and 107 respectively. Second input terminals of gates 106 and 107 are supplied with an alternate 1-0 pulse train signal having a repetition rate equal to one half the tone frequency. The pulse train signal is generated by a flip flop circuit 108 connected to operate as a one-zero generator. This signal is utilized to periodically establish initialized conditions in certain portions of the phase detection apparatus.

The signal produced at the output terminals of gates 106 and 107 is determined by a signal at control terminals 109 and 110 of gates 106 and 107. The control signal comprises the clear correlator signal produced at output terminal 101 of tone pulse detector 90. Gates 106 and 107 operate to produce the sample pulse trains at their output terminals when no clear correlation signal is present, and to produce the 1-0 pulse train signal at their output terminals when a clear correlator signal is present.

Certain portions of the apparatus shown in FIG. 2, such as input signal source 80, reference signal generator 93, frequency synthesizer 94, clock 96, frequency dividers 97 and 98 and one-zero generator 108 may be common to both tone pulse detector 90 and the phase detection apparatus. In addition, digital multipliers 91 and 92, sampling gates 102 and 104 and selector gates 106 and 107 are identical in structure and operation to corresponding elements in tone pulse detector 90. Reference may be made to the previously identified copending application for additional description of the structure and operation of these portions of the phase detection apparatus.

The output signal of gate 106 is supplied to a first shift register 112 which is shown as comprising a first shift register segment 113 and a second shift register segment 114 connected in series. Similarly, the output signal of gate 107 is supplied to a second shift register 115 which is shown as comprising a first shift register segment 116 and a second shift register 117 connected in series. The output signals of gates 106 and 107 are shifted seriatim through shift registers 112 and 115 at a rate determined by the clock pulse train on conductors 99. Shift register segments 114 and 117 frame a moving phase detection window whose duration is determined by the clock pulse rate and the number of shift register storage locations.

Shift register segments 113 and 116 provide a delay interval of sufficient duration so that the phase detection window is centered on a detected tone pulse when the pulse detection signal is produced. This delay is necessary where the tone pulse detector produces a pulse detection signal as the detected tone pulse leaves a pulse detection window defined therein.

An exclusive OR circuit 120 has first and second input terminals 121 and 122 connected to the input and output terminals respectively of shift register segment 114. Similarly, an exclusive OR circuit 124 has input terminals 125 and 126 connected to the input and output terminals respectively of shift register segment 117. Exclusive OR circuits 120 and 124 each produce a low level output signal when both input signals thereto are identical, i.e., both 1 or both 0. Accordingly, a low level output signal is produced when a sample being shifted into the associated shift register has the same value as the sample being shifted out. Further, it can be seen that each exclusive OR circuit produces a high level output signal only when the relative number of 1 and 0 samples within the associated shift register is changing.

Reference numeral 128 identifies a first reversible counter which serves to determine the magnitude and sense of the difference in numbers of 1 and 0 samples within shift register segment 114. Counter 128 has a count control terminal 129 connected to the output terminal of shift register segment 114, an enabling terminal 130 connected to the output terminal of exclusive OR circuit 120, a clearing terminal 131 connected to receive the clear correlator signal from output terminal 101 of tone pulse detector 90 and a timing input terminal connected to conductors 99. Reference numeral 132 identifies a second reversible counter identical to reversible counter 131 and having a count control terminal 133 connected to the output terminal of shift register segment 117, an enabling terminal 134 connected to the output terminal of exclusive OR circuit 124, a clearing terminal 135 connected to receive the clear correlator signal and a timing input terminal connected to conductors 99.

Counters 128 and 132 are operable when enabled by a high level signal at enabling terminals 130 and 134, to count in one sense in response to signals having a value of 1 supplied to count control terminals 129 and 133, and operable to count in the opposite sense in response to samples having a value of 0 supplied to the count control terminals. Counters 128 and 132 are sign-magnitude counters, and each has a count capacity at least as great as the number of storage locations in shift register segments 114 and 117. Accordingly, the magnitude of the count in counter 128 is indicative of the difference between the numbers of 1s and 0s in shift register segment 114. The sign of the count is indicative of whether there are more 0s or more 1s in the shift register segment. Similarly, the count in counter 132 has a magnitude and sign indicative of difference in numbers of 1s and 0s in shift register segment 177 and whether there are more 1s or more 0s therein. Elements 114, 117, 120, 124, 128 and 132 collectively comprise moving window counter means.

Reference numeral 140 identifies computing means connected to receive the counts supplied by counters 128 and 132, and operable to compute therefrom the phase angle of the tone signal relative to the reference signal. Computing means 140 comprises a first holding register 141 connected to receive the first count from counter 128, a second holding register 142 connected to receive the second count from counter 132 and a digital processor 143. Holding registers 141 and 142 and processor 143 also receive the pulse detection signal from output terminal 100 of tone pulse detector 90, and are interconnected to operate as described in connection with holding registers 64 and 66 and processor 74 shown in the block diagram of FIG. 1. Reference may be made to the discussion of FIG. 1 for a more complete description of the structure and operation of computing means 140. As previously indicated, the computing means carries out the algorithm set forth in the flow diagram of FIG. 5 to compute the phase angle and provides a signal indicative of the computed angle at output terminal 144.

Although a preferred embodiment of the applicants' unique phase detection apparatus has been illustrated and described in detail, numerous variations and alternative embodiments within the applicants' contemplation and teaching will be apparent to those skilled in the art. The scope of coverage sought on this invention is not to be limited to the disclosed embodiment, but only the terms of the appended claims.

The embodiments of the invention in which an exclusive property or right is claimed are defined as follows:

1. Phase determining apparatus for measuring the phase of a tone signal of known tone frequency relative to a reference signal of the same frequency, comprising in combination:
   input means for supplying the tone signal;
   clipping means for hard limiting the tone signal to produce a clipped signal having either of two instantaneous amplitudes;
   a reference signal source for generating first and second square wave signals comprising quadrature components of a reference signal having a repetition rate equal to said tone frequency and either of two instantaneous amplitudes substantially equal to those of the clipped signal;
   first and second digital multipliers for multiplying the clipped signal and each of the first and second square wave signals to produce first and second product signals respectively, each having a first value when the instantaneous amplitudes of its multiplicand signals are substantially equal and a second value when the instantaneous amplitudes of its multiplicand signals are different;

sampling means for sampling the first and second product signals at a predetermined sampling rate to provide first and second sample trains respectively;

a first shift register having an input terminal connected to receive the first sample train, an output terminal for subsequently supplying a first sample train, and a predetermined number of storage locations through which samples are shifted seriatim at said sampling rate between the input and output terminals;

a first reversible counter having a count control terminal connected to receive the first sample train from said first shift register, and an enabling terminal for receiving a signal to permit counting in response to samples received at the count control terminal, said first reversible counter being operable to count in one sense in response to samples having said first value and operable to count in the opposite sense in response to samples having said second value;

first enabling means operable to supply a signal to the enabling terminal of said first reversible counter only when the values of the samples at the input and output terminals of said first shift register are different, whereby said first reversible counter produces a first count indicative of the magnitude and sense of the difference in numbers of samples having first and second values in said first shift register;

a second shift register having an input terminal connected to receive the second sample train, an output terminal for subsequently supplying the second sample train, and a predetermined number of storage locations through which samples are shifted seriatim at said sampling rate between the input and output terminals;

a second reversible counter having a count control terminal connected to receive the second sample train from said second shift register, and an enabling terminal for receiving a signal to permit counting in response to samples received at the count control terminal, said second reversible counter means being operable to count in one sense in response to samples having said first value and operable to count in the opposite sense in response to samples having said second value;

second enabling means operable to supply a signal to the enabling terminal of said second reversible counter only when the values of the samples at the input and output terminals of said second shift register are different, whereby said second reversible counter produces a second count indicative of the magnitude and sense of the difference in numbers of samples having first and second values in said second shift register;

processing means for receiving counts indicative of the products of a clipped signal and each of quadrature components of a reference signal, and computing therefrom the phase angle between the clipped signal and the reference signal; and transfer means for transferring the first and second counts from said reversible counters to said computing means, whereby said computing means is operable to compute the phase angle of the tone signal relative to the reference signal.

2. The phase determining apparatus of claim 1 wherein:

said first count varies with phase angle in accordance with a symmetrical bipolar triangular function which has a zero magnitude at phase angles of $\pi/2$ and $3\pi/2$;

said second count varies with phase angle in accordance with a symmetrical bipolar triangular function which has a zero magnitude at phase angles of integral numbers of $\pi$; and said computing means determines which 90° sector includes the phase angle from the polarities of the first and second counts and which of the counts has the larger magnitude, and computes the angular difference and direction of the phase angle from the angle corresponding to the nearest zero magnitude of the first and second counts from the magnitude and polarity of the smaller of the counts.

3. The phase determining apparatus of claim 2 wherein the tone signal frequency $f_0$, sampling rate $f_s$ and number of storage locations N in each of said first and second shift registers are related by the function $Nf_0/f_s = M$, where M is an integer.

4. The phase determining apparatus of claim 3 wherein the number of storage locations in each of said first and second shift registers is determined by the relationship $N/M = I \pm P/M$ where $I$ and $P$ are integers and $P/M$ is a non-reducible fraction.

5. The phase determining apparatus of claim 4 for measuring the phase of periodic tone pulses of known duration, further including:

a tone pulse detector connected to receive the tone signal from said input means, and operable to produce a pulse detection signal upon detection of a tone pulse; and said transfer means is operable to transfer the first and second counts in response to the pulse detection signal.

6. The phase detection apparatus of claim 5 wherein said transfer means comprises first and second holding registers, each having an input terminal connected to receive the count from a separate one of said first and second reversible counters, a first control terminal connected to receive the pulse detection signal and operable to cause the associated holding register to hold the count received thereby, an output terminal connected to said computing means, and a second control terminal connected to said computing means and responsive to a signal received therefrom to cause the associated holding register to produce the count held therein at its output terminal.

7. The phase determining apparatus of claim 6 wherein:

said tone pulse detector determines the degree of correlation between the tone signal and the reference signal during a moving pulse detection window of predetermined duration, and produces the pulse detection signal after a pulse has been detected and the degree of correlation falls below a threshold indicative of presence of a pulse within the window; and said first and second shift registers each include first and second shift register segments of which the second shift register segment provides a moving phase measurement window of the same duration as the pulse detection window, and the first shift register segment delays the sample train supplied to the second shift register segment so as to cause the phase measurement window to be substantially centered on the pulse when the pulse detection signal occurs.

8. Phase determining apparatus for measuring the phase of a tone signal of known frequency relative to a reference signal of the same frequency, comprising in combination:

input means for supplying the tone signal;

clipping means for hard limiting the tone signal to produce a clipped signal having either of upper and lower instantaneous amplitudes;

a reference signal generator for providing first and second square wave signals each having a repetition rate equal to the tone frequency, a quadrature phase relationship to one another, and either of upper and lower instantaneous amplitudes, the first and second square wave signals corresponding to a reference signal;

digital multiplication means for multiplying the clipped signal and each of the first and second square wave signals to produce first and second product signals respectively, each having a first value when its multiplicand signals are of corresponding instantaneous amplitudes, and a second value when its multiplicand signals are of different instantaneous amplitudes;

sampling means for sampling the first and second product signals at a predetermined sampling rate to provide first and second sample trains;

moving window counter means operable to produce first and second counts indicative of the magnitudes and senses of differences in numbers of samples having first and second values in each of the first and second sample trains respectively during a moving time interval of predetermined duration, the first and second counts being indicative of in-phase and quadrature components of the product of the tone signal and the reference signal; and computing means connected to receive the first and second counts, and operable to compute therefrom the phase angle of the tone signal relative to the reference signal.

9. The phase determining apparatus of claim 8 wherein the tone signal frequency $f_0$, sampling rate $f_s$ and number of samples N in each of the first and second sample trains during the moving time interval of predetermined duration are related by the function $Nf_0/f_s = M$, where $M$ is an integer.

10. Phase determining apparatus of claim 9 wherein the number of samples N is determined by the relationship $N/M = I \pm P/M$, where $I$ and $P$ are integers and $P/M$ is a non-reducible fraction.

11. The phase determining apparatus of claim 10 wherein:

said first count varies with phase angle in accordance with a bipolar triangular function which has a zero magnitude at phane angles of $\pi/2$ and $3\pi/2$;

said second count varies with phase angle in accordance with a bipolar triangular function which has a zero magnitude at phase angles of integral numbers of $\pi$; and said computing means determines which 90° sector includes the phase angle from the polarities of the first and second counts and which of the counts has the larger magnitude, and computes the angular difference and direction of the phase angle from the angle corresponding to the nearest zero magnitude of the first and second counts from the magnitude and polarity of the smaller of the counts.

12. A method for determining the phase of a tone signal of known frequency relative to a reference signal of the same frequency, comprising the steps of:

hard limiting the tone signal to produce a clipped signal having either of upper and lower instantaneous amplitudes;

generating first and second quadrature related square wave signals having a repetition rate equal to the tone frequency and either of upper and lower instantaneous amplitudes, said first and second square wave signals corresponding to the reference signal;

multiplying the clipped signal and each of the square wave signals to produce first and second product signals respectively, each having a first value when its multiplicand signals are of corresponding instantaneous amplitudes, and a second value when its multiplicand signals are of different instantaneous amplitudes;

sampling the first and second product signals at a predetermined sampling rate to produce first and second sample trains;

determining the magnitudes and senses of differences in numbers of samples having first and second values in each of the first and second sample trains during a moving time interval of predetermined duration; and computing the phase angle of the tone signal relative to the reference signal from the determined differences.

13. The method of claim 12 wherein the tone signal frequency $f_0$, sampling rate $f_s$ and total number of samples N in each of the first and second sample trains during the moving time interval of predetermined duration are related by the function $Nf_0/f_s = M$, where $M$ is an integer.

14. The method of claim 13 wherein the total number of samples N is determined by the relationship $N/M = I \pm P/M$, where $I$ and $P$ are integers and $P/M$ is a non-reducible fraction.

* * * * *